(12) United States Patent
Kelly et al.

(10) Patent No.: US 7,262,508 B2
(45) Date of Patent: Aug. 28, 2007

(54) INTEGRATED CIRCUIT INCORPORATING FLIP CHIP AND WIRE BONDING

(75) Inventors: Michael G. Kelly, Corvallis, OR (US); Ravindhar K. Kaw, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/678,495

(22) Filed: Oct. 3, 2003

(65) Prior Publication Data
US 2005/0073054 A1  Apr. 7, 2005

(51) Int. Cl.
*H01L 23/48* (2006.01)
*H01L 23/52* (2006.01)
*H01L 29/40* (2006.01)
*H01L 23/02* (2006.01)

(52) U.S. Cl. .................. 257/778; 257/686; 257/784; 257/780; 257/777; 257/E23.085

(58) Field of Classification Search ................ 257/777, 257/778, 686, 780, 784, 723
See application file for complete search history.

(56) References Cited

U.S. PATENT DOCUMENTS

| | | | |
|---|---|---|---|
| 5,646,828 A | * | 7/1997 | Degani et al. ............. 361/715 |
| 5,798,567 A | * | 8/1998 | Kelly et al. ................ 257/723 |
| 6,150,724 A | * | 11/2000 | Wenzel et al. ............. 257/777 |
| 6,177,725 B1 | | 1/2001 | Yamada et al. |
| 6,333,564 B1 | * | 12/2001 | Katoh et al. ............... 257/780 |
| 6,429,530 B1 | | 8/2002 | Chen |
| 6,462,420 B2 | * | 10/2002 | Hikita et al. .............. 257/777 |
| 6,489,686 B2 | * | 12/2002 | Farooq et al. ............. 257/777 |
| 2002/0130422 A1 | * | 9/2002 | Venkateshwaran ......... 257/778 |
| 2003/0222344 A1 | * | 12/2003 | Hosoyamada et al. ...... 257/738 |
| 2004/0200885 A1 | * | 10/2004 | Derderian ................. 228/180.5 |

FOREIGN PATENT DOCUMENTS

FR  2758935  7/1998
JP  58-9223-  *  6/1983 .................. 21/60

OTHER PUBLICATIONS

Office Action from related DE 10 2004 030 541.1-33 in English Translation & German Sep. 1, 2005.

* cited by examiner

*Primary Examiner*—Nitin Parekh

(57) ABSTRACT

An integrated circuit incorporates flip chip and wire bonding techniques to provide an improved integrated circuit device. The integrated circuit device includes a package having a first plurality of bonding pads and a semiconductor substrate within the integrated circuit package and including a second plurality of bonding pads. A semiconductor substrate has a surface area. A plurality of wire bonds connect the first plurality of bonding pads to the second plurality of bonding pads. The device further includes an interconnection substrate mounted on the semiconductor substrate. The interconnection substrate has a surface area smaller than the semiconductor substrate surface area.

11 Claims, 2 Drawing Sheets

INTEGRATED CIRCUIT INCORPORATING FLIP CHIP AND WIRE BONDING

BACKGROUND OF THE INVENTION

Integrated circuits, and more particularly integrated circuit packaging techniques are well known in the art. One packaging technique referred to as flip chip bonding is particularly suited for use in devices having moderately high I/O count. With flip chip bonding, an integrated circuit is bonded directly to a package substrate with solder/bumps carried on the integrated circuit metalization. The package substrate, which is usually multi-layered, includes layers of conductive patterns which makes selective contact with the solder/bumps through vias in the substrate. Flip chip bonding is desirable due to lowered power supply distribution impedance and resulting lowered supply voltage noise. However, flip chip bonding can be expensive. This cost is driven, in important part, by very high routing density demands placed on the package substrate.

Wire bonding is another well known packaging technique. Here, the integrated circuit includes a plurality of bonding pads. The package substrate also includes bonding pads. The bonding pads of the integrated circuit are wire bonded to the package substrate bonding pads. Wire bonding is generally a low cost technique. It places significantly less demands on packaging substrate routing density.

There are many low cost applications where flip chip bonding would not be an economically viable bonding technique while wire bonding would be an economically viable bonding technique. However, many of these applications would benefit from the advantages of flip chip bonding in terms of power distribution throughout the integrated circuit. The present invention addresses this issue by providing a low cost integrated circuit having the advantages of both flip chip bonding and wire bonding.

SUMMARY OF THE INVENTION

In accordance with one aspect of the present invention, the invention provides an integrated circuit including an integrated circuit package having a first plurality of bonding pads, a semiconductor substrate within the integrated circuit package and including a second plurality of bonding pads, and having a surface area, and a plurality of wire bonds connecting selected ones of the first plurality of bonding pads to selected ones of the second plurality of bonding pads. An interconnection substrate is mounted on the semiconductor substrate. The interconnection substrate has a surface area smaller than the semiconductor substrate surface area.

The interconnection substrate may be flip chip bonded to the semiconductor substrate. The interconnection substrate may be formed from an organic material, a ceramic material, or a semiconductor such as silicon.

The interconnection substrate preferably includes a conductive interconnect layer. The semiconductor substrate preferably includes peripheral areas about the interconnect substrate. At least some of the second plurality of bonding pads may be within the peripheral areas. The interconnection substrate may further include at least one filter capacitor. The integrated circuit package may include a cavity and the semiconductor substrate may be adhered to the package within the cavity.

The integrated circuit package may include a substrate wherein the first plurality of bonding pads and the semiconductor substrate are carried by the integrated circuit package substrate.

In accordance with further aspects of the present invention, the invention provides an integrated circuit assembly including a semiconductor substrate including a plurality of bonding pads and having a surface area. The assembly further includes an interconnection substrate flip chip mounted on the semiconductor substrate. The interconnection substrate has a surface area smaller than the semiconductor substrate surface area.

BRIEF DESCRIPTION OF THE DRAWINGS

The foregoing aspects and many of the attended advantages of this invention will become more readily appreciated as the same become better understood by reference to the following detailed description, when taken in conjunction with the accompanying drawings, wherein.

DESCRIPTION OF THE INVENTION

The following discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

Figure 1:
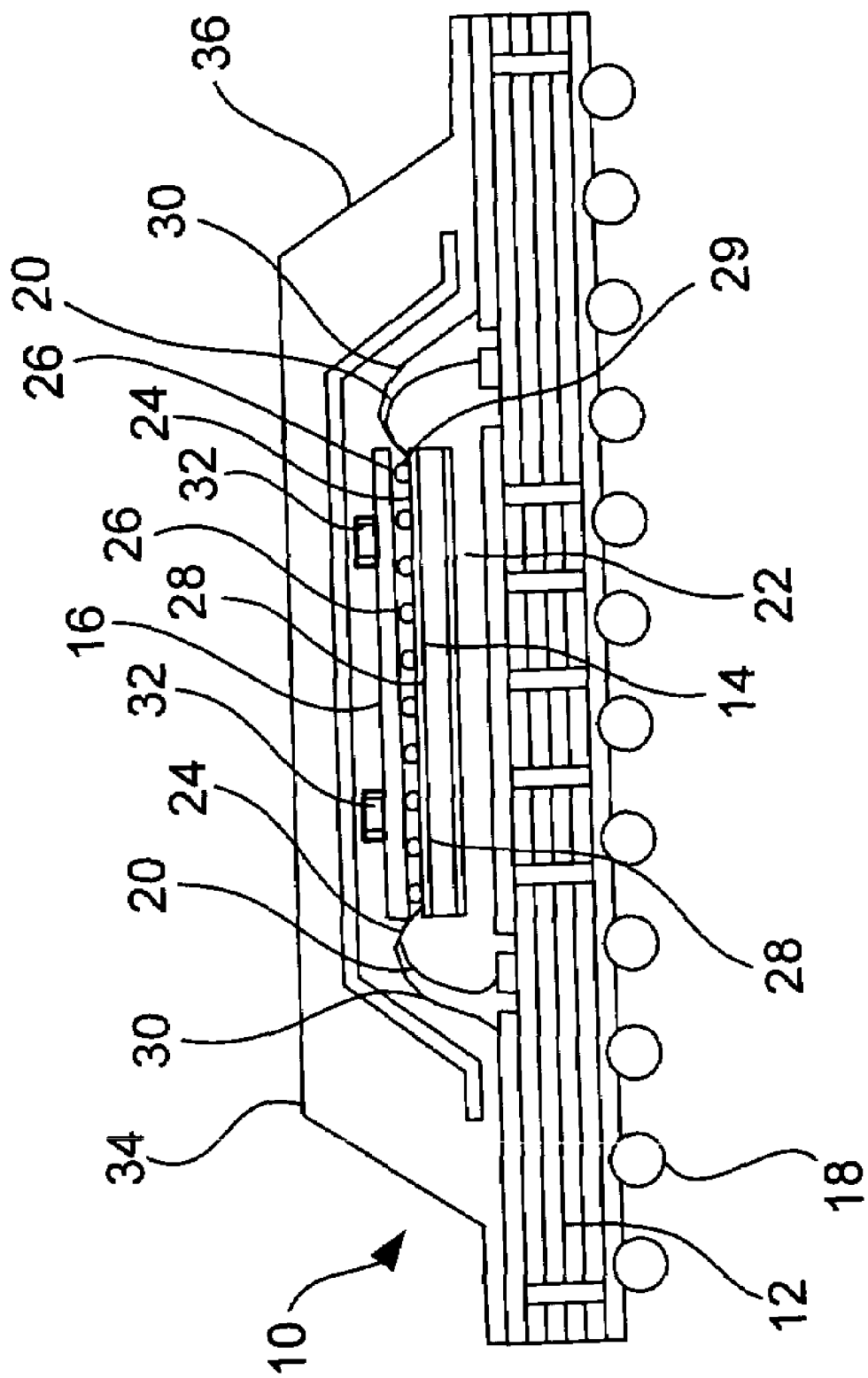
FIG. 1 is a side view, partially in cross section, of an integrated circuit structured in accordance with a first embodiment of the present invention.

Referring now to FIG. 1, it illustrates an integrated circuit device 10 embodying the present invention. The device 10 generally includes a package substrate 12, a semiconductor substrate 14, and an interconnection substrate 16.

The substrate 12 is a multi-layered substrate of the type well known in the art having a plurality of conductive patterns. The substrate 12 carries a plurality of solder balls 18 to facilitate the device 10 being soldered directly to a printed circuit board, for example. The substrate 12 further includes a first plurality of bonding pads 20 which are carried by the substrate 12 in a manner known in the art.

The semiconductor substrate 14 is adhered to the package substrate 12 with adhesive 22 in a known manner. The semiconductor substrate 14, in a manner well known in the art, may include circuits integrally formed therein using well known shadow mask and diffusion techniques. The semiconductor substrate 14 carries a second plurality of bonding pads 24. The bonding pads 24 are coupled to selected portions of the interconnect layer of the semiconductor substrate 14 in a manner well known in the art.

The interconnection substrate 16 is flip chip bonded to the semiconductor substrate 14. To this end, the interconnection substrate carries a plurality of solder balls 26. The interconnection substrate may be formed from an organic material, a ceramic material, or a semiconductor material such as silicon. The interconnection substrate 16 includes at least one conductive interconnect layer 28 formed on the substrate layer. The plurality of solder balls 26 of the interconnection substrate may be utilized to distribute power and ground throughout the semiconductor substrate 14.

As will be noted in FIG. 1, the interconnection substrate has a surface area which is smaller than the surface area of the semiconductor substrate to provide exposed peripheral areas 29. At least some of the second plurality of bonding pads 24 carried by the semiconductor substrate 14 are within the peripheral areas 29.

Selected ones of the first plurality of bonding pads 20 are coupled to selected ones of the bonding pads 24 of the semiconductor substrate 14 to supply power and ground. To this end, the device 10 includes a plurality of bond wires 30 which connect the bonding pads of the substrate 12 to the bonding pads of the semiconductor substrate 14 in a manner known in the art. Hence, power and ground are supplied to the interconnection substrate 16 by wire bonds 30 and peripheral ones of solder balls 26.

The interconnect substrate 16 includes a plurality of filter devices 32 which may include discreet capacitor inductors and/or resistors. The filter devices 32 may be of the type well known in the art for filtering noise from the power supply voltage.

Lastly, the device 10 includes a heat spreader 34 for dissipating heat of the device. Within the heat spreader 34 and external to the heat spreader 34 is a protective compound 36 which serves as a structural component as well as an environmental barrier for the device.

Figure 2:
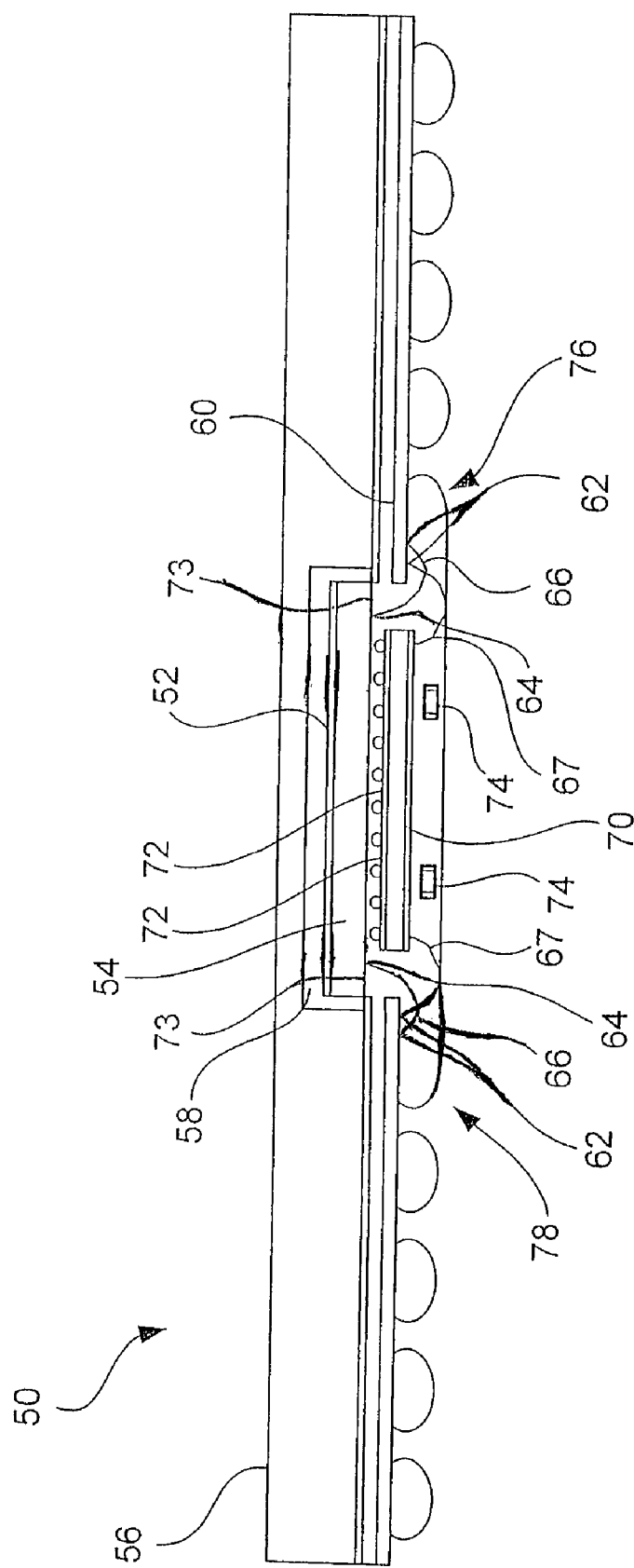
FIG. 2 is a side view, partially in cross section, of an integrated circuit structured in accordance with a further embodiment of the present invention.

Referring now to FIG. 2, it shows another integrated circuit device 50 embodying the present invention. The device 50 is of the type which is referred to as a cavity down configuration wherein the device package includes a cavity 52 which receives the semiconductor substrate 54 therein. The semiconductor substrate 54 is adhered to the package 56 with a suitable adhesive 58.

The package 56 carries a substrate 60. The substrate 60 is preferably a multi-layered substrate providing conductive interconnect patterns. The substrate 60 includes a first plurality of bonding pads 62. The semiconductor substrate 54 carries a second plurality of bonding pads 64. The bonding pads of the semiconductor substrate 54 are wire bonded to the bonding pads 62 of the substrate 60 by wire bonds 66 in a known manner.

An interconnect substrate 70 is carried by the semiconductor substrate 54. The interconnect substrate 70 is flip chip bonded to the semiconductor substrate 54 by a plurality of solder balls 72. Wire bonds 67 also connect selected ones of pads 62. The interconnect substrate 70 may be multi-layered and in turn provide power supply and ground distribution within the semiconductor substrate 54.

The interconnect substrate 70 carries a plurality of filter devices 74 in a known manner for filtering the power supply voltage. Again, the filter devices may include discrete capacitors, inductors, and/or resistance.

The assembly of the semiconductor substrate 54 and interconnection substrate 70 is a delicate assembly which preferably is covered by a protective material or encapsulant 76. The encapsulant 76 may be deposited as a liquid and confined to a specific area by a further material forming a dam 78 in a manner well known in the art. Again, the surface area of the interconnect substrate 70 is smaller than the surface area of the semiconductor substrate 54 to provide peripheral areas 73 within which the bonding pads 64 of the semiconductor substrate are formed.

In accordance with further aspects of the present invention, in either the integrated circuit device of FIG. 1 or the integrated circuit device of FIG. 2, the interconnection substrate may be utilized to distribute power and ground and in addition, any other critical signals requiring a low impedance path or special filtering. The power and ground and critical signals may be coupled to the interconnections of the interconnect substrate by the wire-bonding or the use of a conductive interconnect layer. Hence, integrated circuit devices structured in accordance with various aspects of the present invention have the dual effect of lowering the required substrate routing density on the package substrate while improving electrical performance of the device. The substrate wire density requirement is lessened by the wire bonding while the improved electrical performance is provided by the flip chip mounted interconnection substrates and optional use of discrete capacitors, resistors and devices. As a result, the combined benefit of excellent electrical performance and low cost is achieved.

We claim:

1. An integrated circuit comprising:
   an integrated circuit package having a first plurality of bonding pads;
   a semiconductor substrate within the integrated circuit package, including a circuit and a second plurality of bonding pads, and having a surface area;
   a plurality of wire bonds connecting selected ones of the first plurality of bonding pads to selected ones of the second plurality of bonding pads; and
   an interconnection substrate mounted on the semiconductor substrate, the interconnection substrate having a surface area smaller than the semiconductor substrate surface area wherein the semiconductor substrate includes peripheral areas about the interconnect substrate and wherein at least some of the second plurality of bonding pads are within the peripheral areas.

2. The integrated circuit of claim 1 wherein the interconnection substrate is flip chip bonded to the semiconductor substrate.

3. The integrated circuit of claim 1 wherein the interconnection substrate is formed from one of an organic material, ceramic, and silicon.

4. The integrated circuit of claim 1 wherein the interconnection substrate further includes at least one filter capacitor.

5. The integrated circuit of claim 1 wherein the integrated circuit package includes a cavity and wherein the semiconductor substrate is adhered to the package within the cavity.

6. The integrated circuit of claim 1 wherein the integrated circuit package includes a substrate and wherein the first plurality of bond pads and the semiconductor substrate are carried by the integrated circuit package substrate.

7. An integrated circuit comprising:
   an integrated circuit package having a first plurality of bonding pads;
   a semiconductor substrate within the integrated circuit package, including a circuit and a second plurality of bonding pads, and having a surface area;
   a plurality of wire bonds connecting selected ones of the first plurality of bonding pads to selected ones of the second plurality of bonding pads; and
   an interconnection substrate flip chip mounted on the semiconductor substrate, the interconnection substrate having a surface area smaller than the semiconductor substrate surface area forming exposed peripheral areas in the semiconductor substrate and wherein the second plurality of bonding pads are within the peripheral areas.

8. The integrated circuit of claim 7 wherein the interconnection substrate is formed from one of an organic material, ceramic, and silicon.

9. The integrated circuit of claim 7 wherein the interconnection substrate further includes at least one filter capacitor.

10. The integrated circuit of claim 7 wherein the integrated circuit package includes a cavity and wherein the semiconductor substrate is adhered to the package within the cavity.

11. The integrated circuit of claim 7 wherein the integrated circuit package includes a substrate and wherein the first plurality of bond pads and the semiconductor substrate are carried by the integrated circuit package substrate.

* * * * *